US012405308B2

(12) United States Patent
Jang et al.

(10) Patent No.: US 12,405,308 B2
(45) Date of Patent: Sep. 2, 2025

(54) CONTROL PROGRAM, CONTAINER AND SEMICONDUCTOR DEVICE MANUFACTURING SYSTEM FOR CHARGING OF WAFER TYPE SENSOR AND AUTO TEACHING

(71) Applicant: SEMES Co., Ltd., Chungcheongnam-do (KR)

(72) Inventors: Yong Seok Jang, Chungcheongnam-do (KR); In Kyu Park, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 403 days.

(21) Appl. No.: 17/543,884

(22) Filed: Dec. 7, 2021

(65) Prior Publication Data
US 2022/0179000 A1    Jun. 9, 2022

(30) Foreign Application Priority Data

Dec. 9, 2020 (KR) .................. 10-2020-0171125
Mar. 23, 2021 (KR) .................. 10-2021-0037356

(51) Int. Cl.
*H02J 7/00*    (2006.01)
*G01R 31/36*    (2020.01)
(Continued)

(52) U.S. Cl.
CPC ........ *G01R 31/36* (2013.01); *H01J 37/32715* (2013.01); *H01J 37/32899* (2013.01);
(Continued)

(58) Field of Classification Search
CPC ................ H01L 21/67259; H01L 21/68; H01J 37/32715; H02J 50/90
See application file for complete search history.

(56) References Cited

U.S. PATENT DOCUMENTS 6,558,962 B2    5/2003  Nishiki
7,135,852 B2    11/2006 Renken et al.
(Continued)

FOREIGN PATENT DOCUMENTS

CN    102737940 A    10/2012
CN    102934213 A    2/2013
(Continued)

OTHER PUBLICATIONS

Japanese Notice of Reasons for Refusal for Japanese Application No. 2021-198285, dated Jan. 31, 2023 with translation, 14 pages.
(Continued)

*Primary Examiner* — Joseph A Miller, Jr.
(74) *Attorney, Agent, or Firm* — Buchanan Ingersoll & Rooney PC

(57) ABSTRACT

The present disclosure provides a control device for charging and auto teaching of a wafer type sensor, a control program executed by the control device, a wafer type sensor storage device, a wafer type sensor charging device, and a semiconductor device manufacturing facility. The control program is a program executed by a control device equipped with a processor, and monitors a semiconductor device manufacturing facility and its part using a wafer type sensor, and monitors the remaining battery level of the wafer type sensor.

8 Claims, 16 Drawing Sheets

(51) Int. Cl.
  *H01J 37/32* (2006.01)
  *H01L 21/67* (2006.01)
  *H01L 21/68* (2006.01)

(52) U.S. Cl.
  CPC .. *H01J 37/32926* (2013.01); *H01L 21/67201* (2013.01); *H01L 21/67259* (2013.01); *H01L 21/68* (2013.01); *H02J 7/0048* (2020.01)

(56) References Cited

U.S. PATENT DOCUMENTS

| | | |
|---|---|---|
| 7,855,549 B2 | 12/2010 | Renken et al. |
| 10,014,198 B2 | 7/2018 | Richardson |
| 10,541,168 B2 | 1/2020 | Tan et al. |
| 10,665,490 B2 | 5/2020 | Lee et al. |
| 11,569,138 B2 | 1/2023 | Azarya et al. |
| 2007/0142962 A1* | 6/2007 | Takizawa .......... H01L 21/67781 414/744.5 |
| 2008/0087116 A1* | 4/2008 | Rate .................. H01L 21/67259 73/865.9 |
| 2012/0247954 A1 | 10/2012 | Yamawaku et al. |
| 2013/0080099 A1* | 3/2013 | Akada ..................... H02J 50/12 307/104 |
| 2014/0122654 A1* | 5/2014 | Jensen ............. G05B 19/41865 709/219 |
| 2014/0346467 A1 | 11/2014 | Yun et al. |
| 2017/0053819 A1 | 2/2017 | Richardson |
| 2018/0025928 A1 | 1/2018 | Chito |
| 2018/0301322 A1 | 10/2018 | Sugita et al. |
| 2019/0033103 A1 | 1/2019 | Sugita et al. |
| 2020/0194295 A1 | 6/2020 | Sugita et al. |
| 2023/0119169 A1 | 4/2023 | Azarya et al. |

FOREIGN PATENT DOCUMENTS

| | | |
|---|---|---|
| CN | 104183529 A | 12/2014 |
| CN | 104823273 A | 8/2015 |
| CN | 107644830 A | 1/2018 |
| CN | 107690604 A | 2/2018 |
| CN | 108091589 A | 5/2018 |
| JP | 2007-536726 A | 12/2007 |
| JP | 2011091071 A | 5/2011 |
| JP | 2011238823 A | 11/2011 |
| JP | 2018526814 A | 9/2018 |
| JP | 6598745 B2 | 10/2019 |
| JP | 2020-096122 A | 6/2020 |
| KR | 1020020066201 A1 | 8/2002 |
| KR | 1020060135926 A | 12/2006 |
| KR | 20070009600 A | 1/2007 |
| KR | 1020170022907 A | 3/2017 |
| KR | 1020190011617 A | 2/2019 |
| KR | 1020190072669 A | 6/2019 |
| KR | 20200004684 A | 1/2020 |
| TW | 201842301 A | 12/2018 |
| WO | 2005088683 A3 | 9/2005 |
| WO | 2021180607 A1 | 9/2020 |

OTHER PUBLICATIONS

Korean Request for the Submission of an Opinion for Korean Application No. 10-2021-0037356, dated Oct. 24, 2022 with translation, 20 pages.

Office Action (The First Office Action) issued Mar. 26, 2025, by the State Intellectual Property Office of People's Republic of China in corresponding Chinese Patent Application No. 202111515895.9 and an English translation of the Office Action. (23 pages).

* cited by examiner

CONTROL PROGRAM, CONTAINER AND SEMICONDUCTOR DEVICE MANUFACTURING SYSTEM FOR CHARGING OF WAFER TYPE SENSOR AND AUTO TEACHING

CROSS REFERENCE TO RELATED APPLICATION

This application claims the benefit of Korean Patent Application No. 10-2020-0171125, filed on Dec. 9, 2020, and 10-2021-0037356, filed on Mar. 23, 2021, in the Korean Intellectual Property Office, the disclosure of which is incorporated herein by reference in its entirety.

FIELD OF THE INVENTION

The present invention relates to a wafer type sensor control device, a control program executed by the control device, a wafer type sensor storage device (container), a wafer type sensor charging device (load port module), and a semiconductor device manufacturing facility including the wafer type sensor charging device. More particularly, it relates to a control device, a control program, a container, a load port module, and a semiconductor device manufacturing facility for charging and auto teaching of a wafer type sensor.

BACKGROUND OF THE INVENTION

The semiconductor device manufacturing process may be continuously performed in a semiconductor device manufacturing facility, and may be divided into a pre-process and a post-process. The semiconductor manufacturing facility may be installed in a space defined as a FAB to manufacture semiconductor devices.

The pre-process refers to a process of forming a circuit pattern on a substrate (e.g., a wafer) to complete a chip. These pre-processes may comprise a deposition process for forming a thin film on a substrate, a photo lithography process for transferring a photo resist onto a thin film using a photo mask, an etching process for selectively removing unnecessary parts using a chemical material or reactive gas in order to form a desired circuit pattern on a substrate, an ashing process for removing the photoresist remaining after etching, an ion implantation process for implanting ions into the portion connected to a circuit pattern to have characteristics of an electronic device, a cleaning process for removing contamination sources from the substrate, and the like.

The post-process refers to the process of evaluating the performance of the product finished through the pre-process. The post-processes may comprise a board inspection process fort determining good products or defective products by inspecting the operation of each chip on the board, a package process for cutting and separating each chip through dicing, die bonding, wire bonding, molding, marking, etc. to have the shape of the product, a final inspection process for finally inspecting product characteristics and reliability through electrical characteristic inspection and burn-in inspection, and the like.

SUMMARY OF THE INVENTION

In a semiconductor device manufacturing process, an etching chamber may be used to form a desired circuit pattern on a substrate. Such an etching facility may etch the substrate using plasma.

When the etching facility uses plasma, an electrostatic chuck (ESC) may be installed as a substrate support unit to be used as a lower electrode. In this case, a ring assembly may be formed around the electrostatic chuck in order to prevent the side surface of the electrostatic chuck from being damaged by the plasma and to increase the efficiency of substrate etching.

However, since the ring assembly is a consumable part that is gradually etched over time, it may adversely affect the substrate processing process if it is not periodically corrected in the position or replaced.

An aspect of the present disclosure is an auto teaching system for monitoring a semiconductor device manufacturing facility and its part using a wafer type sensor, a control device included therein, and a control program executed by the control device.

In addition, an aspect of the present disclosure is an auto teaching system that automatically charges the wafer type sensor for smooth use in case of emergency, and a wafer type sensor storage device (container) included therein, and a wafer type sensor charging device (load port module), and semiconductor device manufacturing facility.

Aspects of the present disclosure are not limited to the aspects mentioned above, and other aspects not mentioned will be clearly understood by those skilled in the art from the following description.

One aspect of the control program of the present disclosure for achieving the above object is a control program executed by a control device equipped with a processor, and comprises an instruction for monitoring a semiconductor device manufacturing facility and its part by using a wafer type sensor, and an instruction for monitoring a remaining battery level of the wafer type sensor.

The control program may further comprise an instruction for monitoring whether a consumable part is centered in a substrate processing apparatus.

The control program may further comprise an instruction for monitoring whether the consumable part is centered in response to the consumable part being replaced.

Wherein the wafer type sensor may measure a gap between the consumable part and a chuck.

The control program may further comprise an instruction for correcting a position of the consumable part by using a transfer robot based on correction information related to centering, in response to the consumable part being not centered.

The control program may further comprise an instruction for charging the wafer type sensor using a battery charging device installed in a load port module (LPM) based on a remaining battery level of the wafer type sensor being less than a reference value.

The control program may further comprise an instruction for mounting the wafer type sensor in a container for charging the wafer type sensor.

The control program may further comprise an instruction for seating the container, in which the wafer type sensor is mounted, on the load port module for charging the wafer type sensor.

The control program may further comprise an instruction for monitoring a semiconductor device manufacturing facility and its parts after charging the wafer type sensor based on a remaining battery level of the wafer type sensor being less than a reference value.

One aspect of the wafer type sensor storage device (container) of the present disclosure for achieving the above object includes a wafer type sensor, and charges the wafer type sensor using a load port module having a battery charging device.

Wherein the container may charge the wafer type sensor in response to the wafer type sensor being mounted.

Wherein the wafer type sensor may be mounted in the container for charging the wafer type sensor.

The container may comprise a plurality of slots installed in a vertical direction inside the container.

The container may comprise a first slot installed inside the container; and a second slot installed under the first slot, wherein different objects may be mounted in the first slot and the second slot.

Wherein the wafer type sensor may be mounted in the first slot.

Wherein the container may charge the wafer type sensor based on a monitoring result of a remaining battery level of the wafer type sensor.

Wherein the container may be a FOUP.

Wherein the container may charge the wafer type sensor using at least one of a magnetic resonance method and an electromagnetic induction method.

One aspect of the wafer type sensor charging device (load port module) of the present disclosure for achieving the above object comprises a battery charging device, wherein a wafer type sensor mounted in a container is charged using the battery charging device.

Wherein the battery charging device may comprise a power supply module for supplying first power; a power conversion module installed inside the load port module and for converting the first power into second power; and a power output terminal installed above the load port module and connected to a connector of the container.

Wherein the battery charging device may charge the wafer type sensor in response to the container being seated on the load port module.

One aspect of the semiconductor device manufacturing facility of the present disclosure for achieving the above object comprise a load port module installed as a front end module (FEM); an index module installed adjacent to the load port module and including a first transfer robot for transferring a substrate mounted in a container on the load port module; a plurality of process chambers for processing the substrate; and a transfer chamber installed adjacent to the process chamber and having a second transfer robot for carrying in an unprocessed substrate transferred by the first transfer robot into the process chamber, or carrying out a pre-processed substrate from the process chamber, wherein the load port module includes a battery charging device, wherein a wafer type sensor mounted in the container is charged using the battery charging device.

Wherein the load port module may be plural.

Wherein each container seated on each load port module may mount different objects.

Wherein, among each of the containers, one container may mount the wafer type sensor, and the other container may mount the substrate.

Wherein a plurality of process chambers may be disposed according to any one structure of a cluster platform, a quad platform, and an inline platform.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
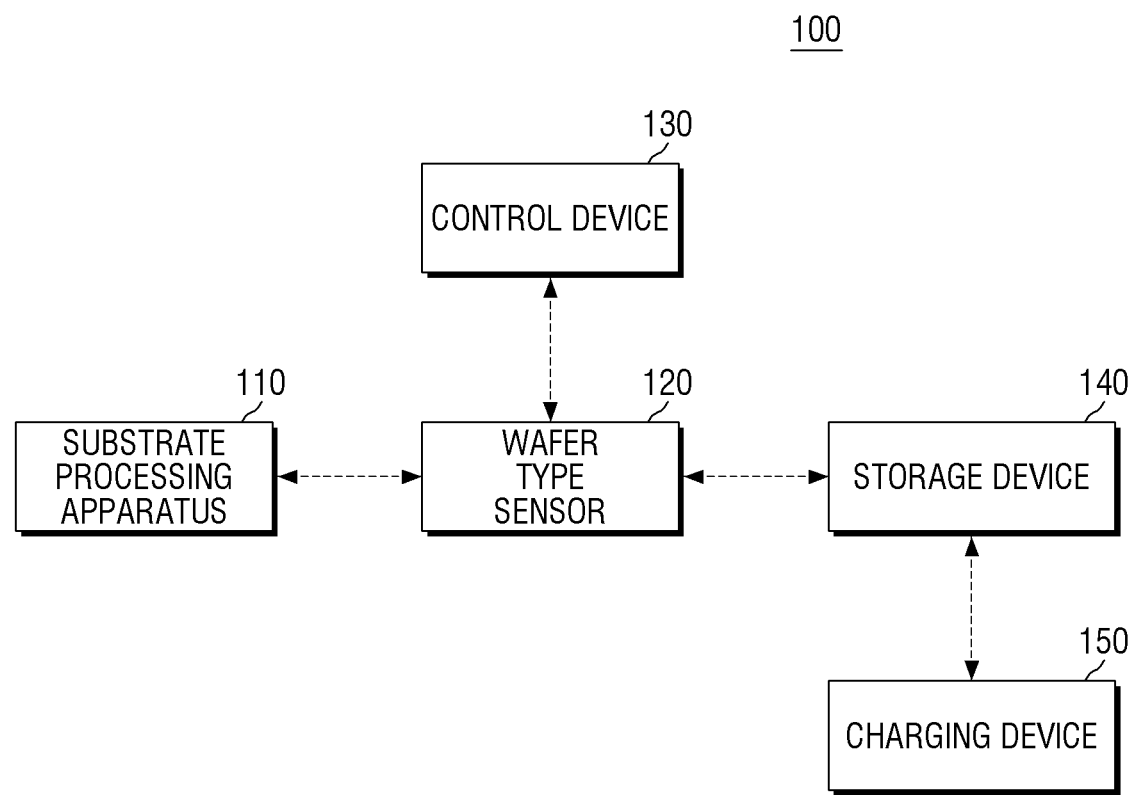
FIG. 1 is a diagram schematically illustrating an internal configuration of an auto teaching system according to an embodiment of the present disclosure.

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided only for making the description of the present invention complete and fully informing those skilled in the art to which the present invention pertains on the scope of the invention, and the present invention is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present invention.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present invention belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

The present disclosure relates to a semiconductor device manufacturing facility used for manufacturing a semiconductor device and an auto teaching system applied to inspecting parts thereof. The auto teaching system according to the present disclosure can monitor a semiconductor device manufacturing facility and its parts using a wafer type sensor, and can automatically charge the wafer type sensor.

Specifically, a semiconductor device manufacturing facility and its parts can be monitored using a control device constituting the auto teaching system and a program executed by the control device, and a storage device and charging device constituting the auto teaching system can be used to automatically charge the wafer type sensor for smooth use in case of emergency.

Hereinafter, the present disclosure will be described in detail with reference to drawings and the like.

FIG. 1 is a diagram schematically illustrating an internal configuration of an auto-teaching system according to an embodiment of the present disclosure.

The auto teaching system 100 is applied to a semiconductor device manufacturing facility, and is a system for auto teaching full automation.

Referring to FIG. 1, the auto teaching system 100 may include a substrate processing apparatus 110, a wafer type sensor 120, a control device 130, a storage device 140, and a charging device 150.

The substrate processing apparatus 110 is an apparatus for processing a substrate (e.g., a wafer). The substrate processing apparatus 110 may be implemented as, for example, an etching process chamber for performing an etching process on a substrate, a cleaning process chamber for performing a cleaning process on a substrate, and the like.

Figure 2:
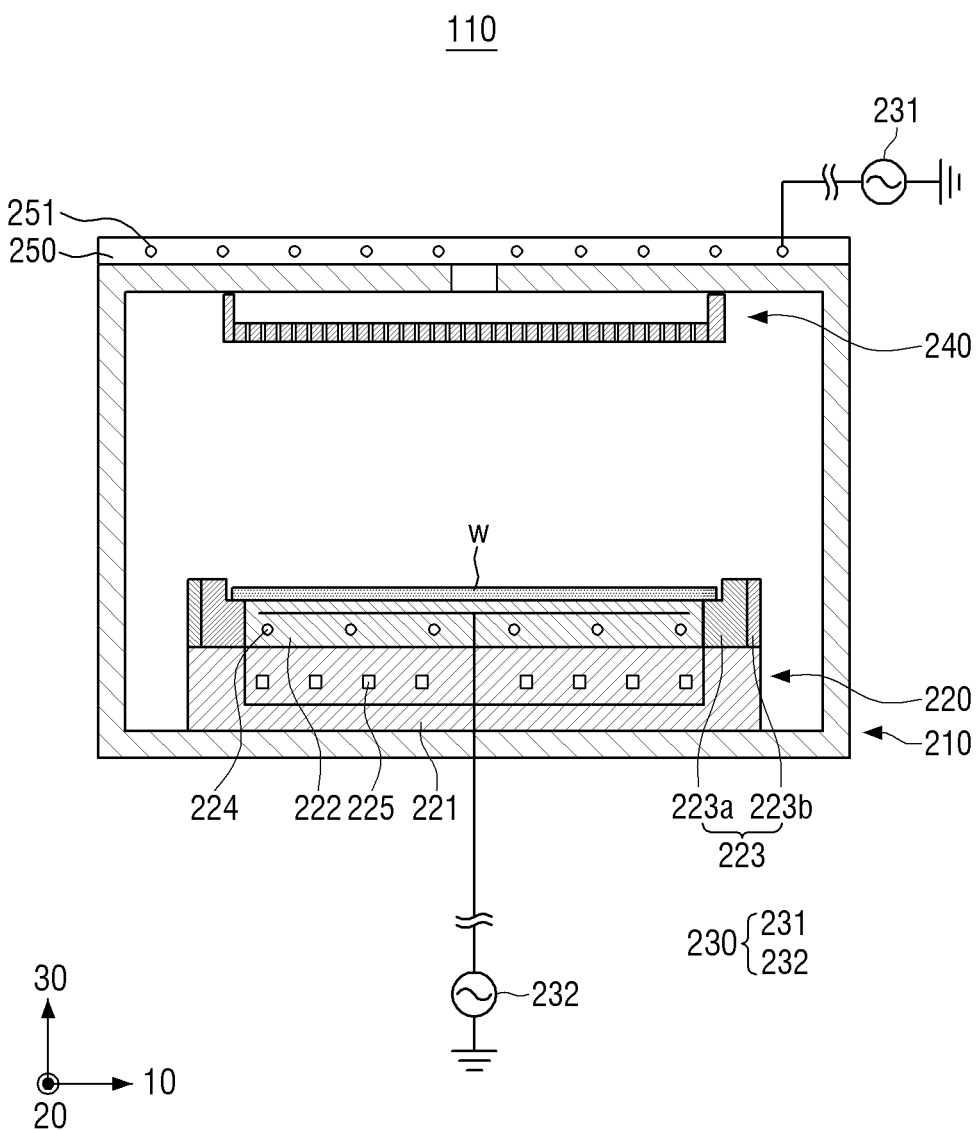
FIG. 2 is a diagram schematically illustrating an internal structure of a substrate processing apparatus constituting an auto teaching system according to an embodiment of the present disclosure.

When the substrate processing apparatus 110 is implemented as an etching process chamber, a cleaning process chamber, etc., as shown in FIG. 2, a housing 210, a substrate support unit 220, a plasma generating unit 230, and a shower head unit 240 may be included.

FIG. 2 is a diagram schematically illustrating an internal structure of a substrate processing apparatus constituting an auto teaching system according to an embodiment of the present disclosure. The following description refers to FIG. 2.

The substrate processing apparatus 110 may process the substrate W using a dry etching process and/or a dry cleaning process in a vacuum environment. The substrate processing apparatus 110 may process the substrate W using, for example, a plasma process.

The housing 210 provides a space, in which the plasma process is performed. The housing 210 may include an opening (not shown) provided as a passage, through which the substrate W enters and exits, on its sidewall.

The substrate support unit 220 is installed in the inner lower region of the housing 210 and may support the substrate W using electrostatic force. However, the present embodiment is not limited thereto. The substrate support unit 220 may support the substrate W in various ways such as mechanical clamping, vacuum, and the like.

When the substrate W is supported by using an electrostatic force, the substrate support unit 220 may include a base 221 and an electrostatic chuck (ESC) 222.

The electrostatic chuck 222 is a substrate support member that supports the substrate W seated thereon by using an electrostatic force. The electrostatic chuck 222 may be made of a ceramic material, and may be coupled to the base 221 to be fixed on the base 221.

The ring assembly 223 is provided to surround the edge of the electrostatic chuck 222. The ring assembly 223 may be provided in a ring shape to support the edge region of the substrate W. The ring assembly 223 may include a focus ring 223a and an edge ring 223b.

The focus ring 223a is formed inside the edge ring 223b and is provided to surround the electrostatic chuck 222. The focus ring 223a may be made of a silicon material, and may concentrate ions generated during a plasma process onto the substrate W.

The edge ring 223b is formed outside the focus ring 223a and is provided to surround the focus ring 223a. The edge ring 223b may be made of a quartz material, and may be formed to prevent a side surface of the electrostatic chuck 222 from being damaged by plasma.

The heating member 224 and the cooling member 225 are provided so that the substrate W can maintain the process temperature while the etching process is in progress inside the housing 210. The heating member 224 and the cooling member 225 may be installed, for example, inside the electrostatic chuck 222 and inside the base 221, respectively.

The plasma generating unit 230 generates plasma from the gas remaining in the discharge space. Here, the discharge space refers to a space located above the substrate support unit 220 in the inner space of the housing 210.

The plasma generating unit 230 may generate plasma in the discharge space inside the housing 210 using an inductively coupled plasma (ICP) source. In this case, the plasma generating unit 230 may use an antenna unit 251 installed in the upper module 250 as an upper electrode and use the electrostatic chuck 222 as a lower electrode.

However, the present embodiment is not limited thereto. The plasma generating unit 230 may generate plasma in the discharge space inside the housing 210 using a capacitively coupled plasma (CCP) source. In this case, the plasma generating unit 230 may use the shower head unit 240 as an upper electrode and the electrostatic chuck 222 as a lower electrode.

The plasma generating unit 230 may include an upper electrode, a lower electrode, an upper power supply 231, and a lower power supply 232.

The upper power supply 231 applies power to the upper electrode. The upper power supply 231 may be provided to control the characteristics of the plasma. The upper power supply 231 may be provided to adjust, for example, ion bombardment energy.

The lower power supply 232 applies power to the lower electrode. The lower power supply 232 may serve as a plasma source for generating plasma or may serve to control characteristics of plasma together with the upper power supply 231.

The shower head unit 240 may be installed to face the electrostatic chuck 222 in the vertical direction (the third direction 30) inside the housing 210. The shower head unit 240 may include a plurality of gas feeding holes to inject gas into the housing 210, and may be provided to have a larger diameter than the electrostatic chuck 222. The shower head unit 240 may be made of a silicon material or a metal material.

In the above description, the substrate processing apparatus 110 has been described as being included in the auto teaching system 100, but in this embodiment, it is also possible that the auto teaching system 100 includes a semiconductor device manufacturing facility instead of the substrate processing apparatus 110. The semiconductor device manufacturing facility includes the substrate processing apparatus 110, which will be described later, and a process chamber constituting the semiconductor device manufacturing facility may correspond to the substrate processing apparatus 110. Meanwhile, in the present embodiment, the auto teaching system 100 itself may be a semiconductor device manufacturing facility.

It will be described again with reference to FIG. 1.

The wafer type sensor 120 is applied to inspect semiconductor device manufacturing facilities and their parts. The wafer type sensor 120 may be applied to auto teaching for a semiconductor device manufacturing facility and its part, robot monitoring (e.g., robot-related vibration, torque, encoder, slope and position monitoring) used for substrate transfer in a semiconductor device manufacturing facility, and temperature and pressure measurement in semiconductor device manufacturing facilities.

Figure 3:
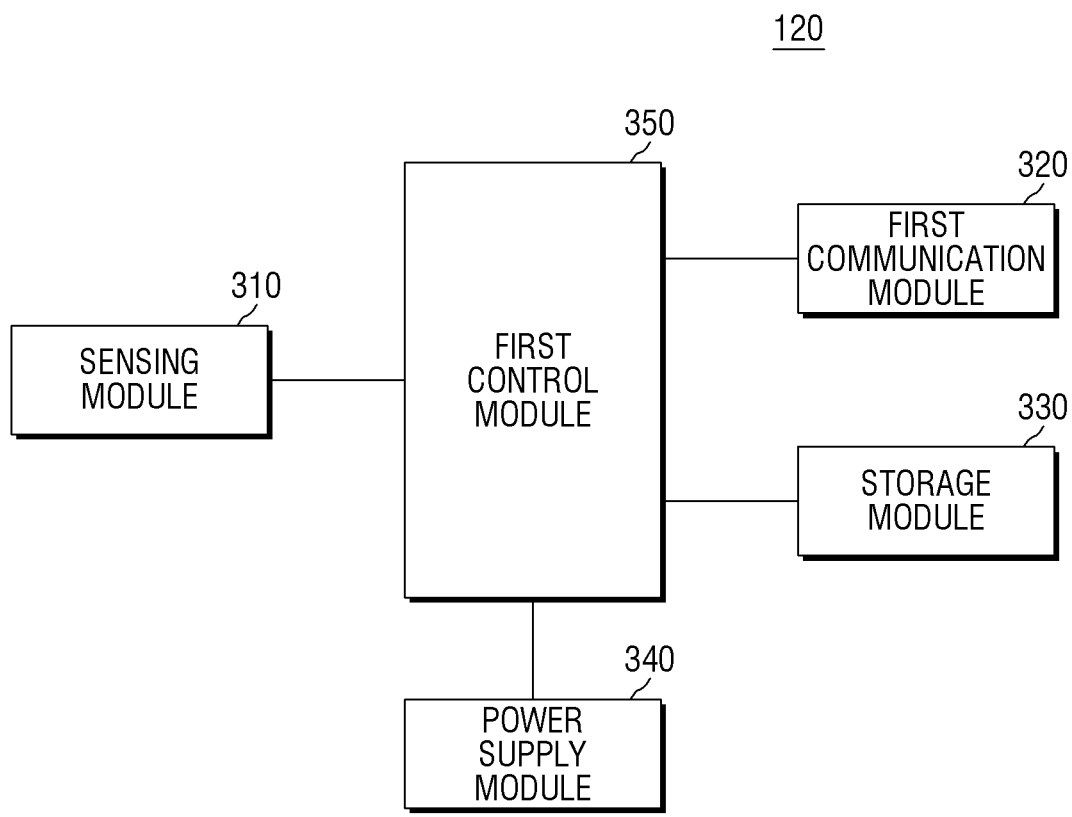
FIG. 3 is a diagram schematically illustrating an internal configuration of a wafer type sensor constituting an auto teaching system according to an embodiment of the present disclosure.

The wafer type sensor 120 may comprise a sensing module 310, a first communication module 320, a storage module 330, a power supply module 340 and a first control module 350 to perform the above functions, as shown in FIG. 3.

FIG. 3 is a diagram schematically illustrating an internal configuration of a wafer type sensor constituting an auto teaching system according to an embodiment of the present disclosure. The following description refers to FIG. 3.

The sensing module 310 detects various signals and information necessary for inspecting a semiconductor device manufacturing facility and its part. The sensing module 310 may include an image signal detector (e.g., a camera), a light signal detector (e.g., a laser beam detector), and the like in this embodiment.

In addition, the sensing module 310 may further comprise, for example, an acceleration information detector (accelerometer), an inclination information detector (inclinometer), a direction information detector (directional compass), a magnetic field directional detector, a magnetic field strength detector, a temperature information detector (thermometer), a pressure detector, a humidity detector, an acoustic detector, an acidity detector, a chemical moiety activity detector, and the like.

The first communication module 320 transmits signals and information detected by the sensing module 310 to the outside. The first communication module 320 may transmit, for example, a detection signal and information to the control device 130.

The first communication module 320 may transmit the detection signal and information in a wireless manner. In this case, the first communication module 320 may use WiFi in a wireless manner. However, the present embodiment is not limited thereto. In the present embodiment, any method can be adopted and applied as long as it is a method capable of wirelessly transmitting and receiving data. Meanwhile, the first communication module 320 may transmit the detection signal and information in a wired manner.

On the other hand, the first communication module 320 may also receive a specific signal and information from the outside.

The storage module 330 stores signals and information detected by the sensing module 310, signals and information received from the outside by the first communication module 320, and the like. The storage module 330 may include at least one memory chip.

The power supply module 340 provides power so that each component constituting the wafer type sensor 120, that is, the sensing module 310, the first communication module 320, the storage module 330, the first control module 350, etc. operate smoothly. The power supply module 340 may include at least one battery.

The first control module 350 controls the entire operation of each component constituting the wafer type sensor 120, that is, the sensing module 310, the first communication module 320, the storage module 330, the power supply module 340, and the like. The first control module 350 may be implemented as a processor such as a main processing unit (MPU), a central processing unit (CPU) or a micro processing unit (MPU), and in this embodiment, it could be understood as a concept including a digital signal processor (DSP).

On the other hand, the wafer type sensor 120 may further include an A/D converter (analog to digital converter), a power ON/OFF switch, and a lighting module including a plurality of light emitting diodes (LEDs).

Previously, it has been described that the sensing module 310 may include an image signal detector. In this case, the wafer type sensor 120 may be implemented as, for example, a vision wafer, that is a substrate, in which a camera module is embedded.

Figure 4:
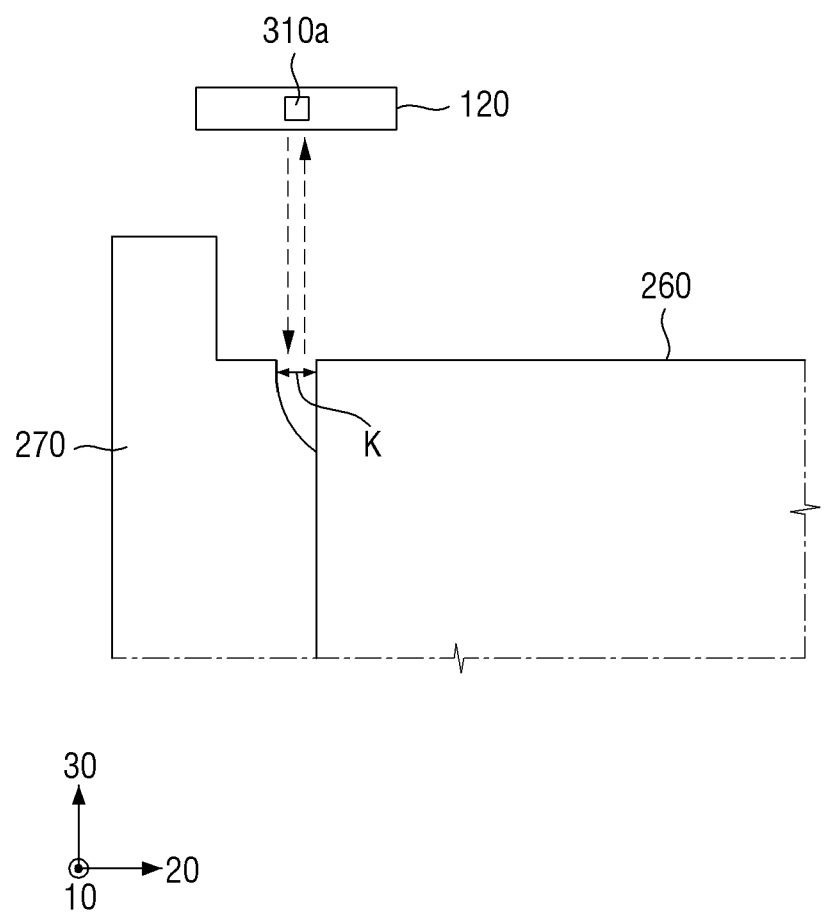
FIG. 4 is a first exemplary view for describing the role of the wafer type sensor constituting the auto teaching system according to an embodiment of the present disclosure.

When the wafer type sensor 120 is implemented as a vision wafer, in which the camera module 310a is embedded, as shown in FIG. 4, it may be used to measure the gap K between the chuck member 260 and the consumable part 270 in the substrate processing apparatus 110. In the above, the consumable part 270 may be a ring-shaped member disposed in the substrate processing apparatus 110 to surround the substrate W. The consumable part 270 may be, for example, a focus ring 223a or an edge ring 223b. Meanwhile, the chuck member 260 may be an electrostatic chuck 222. FIG. 4 is a first exemplary view for describing the role of the wafer type sensor constituting the auto teaching system according to an embodiment of the present disclosure.

Figure 5:
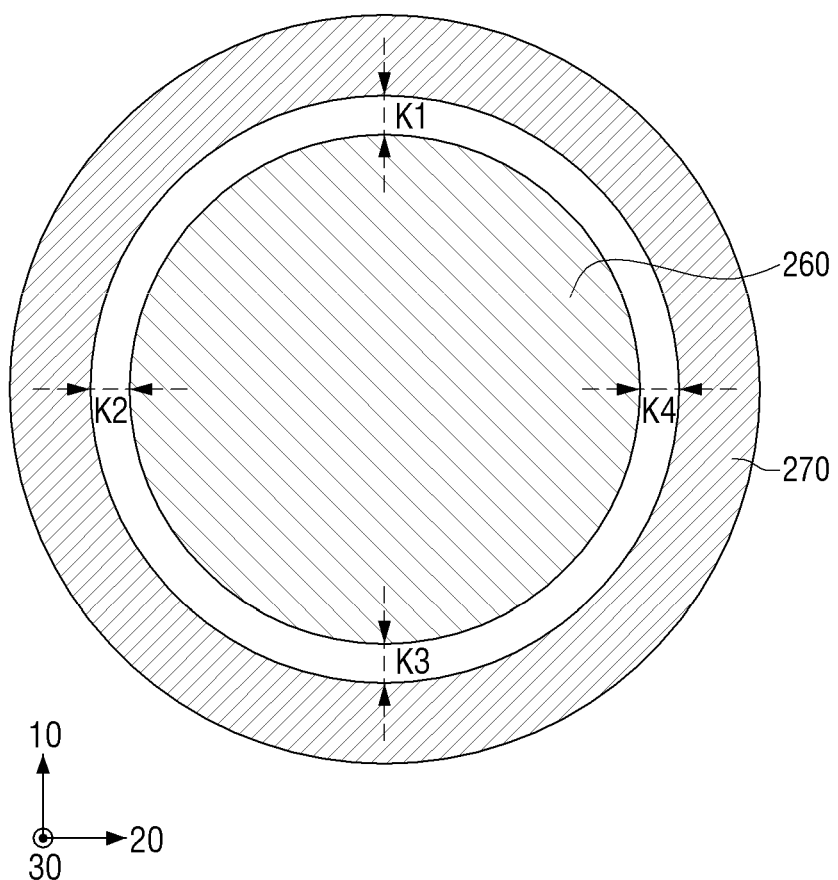
FIG. 5 is a second exemplary view for describing the role of the wafer type sensor constituting the auto teaching system according to an embodiment of the present disclosure.

On the other hand, when the wafer type sensor 120 measures the gap K between the chuck member 260 and the consumable part 270, as shown in the example of FIG. 5, a plurality of pieces of information (e.g., K1, K2, K3, K4) about the gap with the consumable part 270 on each side of the chuck member 260 may be obtained.

The gap K1, K2, K3, and K4 between the chuck member 260 and the consumable part 270 obtained in this way may be utilized for centering the consumable part 270 with respect to the chuck member 260. FIG. 5 is a second exemplary view for describing the role of the wafer type sensor constituting the auto teaching system according to an embodiment of the present disclosure.

On the other hand, when the wafer type sensor 120 is implemented as a vision wafer, it may be used to obtain image information about a part in a semiconductor device manufacturing facility or a substrate processing apparatus.

Meanwhile, the sensing module 310 may comprise a light signal detector, for example, a laser beam detector, and in this case, the wafer type sensor 120 may be used to measure the height of the consumable part 270.

It will be described again with reference to FIG. 1.

The control device 130 inspects a semiconductor device manufacturing facility including the substrate processing apparatus 110 and its parts by using the wafer type sensor 120. The control device 130 may be implemented as, for example, a cluster tool controller (CTC) that performs facility monitoring using the wafer type sensor 120.

As described above, the wafer type sensor 120 may measure the gap between the chuck member 260 and the consumable part 270 in order to determine whether the consumable part 270 replaced with a new one is properly seated on the chuck member 260. In this case, the control device 130 corrects a vacuum transfer robot (VTR) for seating the consumable part 270 around the chuck member 260 based on the information obtained by the wafer type sensor 120 (that is, information about the gap between the chuck member 260 and the consumable part 270). Then, when the consumable part 270 is replaced and installed around the chuck member 260, the VTR may center the consumable part 270 with respect to the chuck member 260 under the control of the control device 130.

The control device 130 may monitor the remaining battery level of the wafer type sensor 120. Specifically, the control device 130 compares the remaining battery level of the wafer type sensor 120 with the reference value, and when it is determined that the remaining battery level of the wafer type sensor 120 is less than the reference value, it may serve to control the wafer-type sensor 120 to be charged.

Hereinafter, various roles of the control device 130 will be described in more detail with reference to the drawings.

Figure 6:
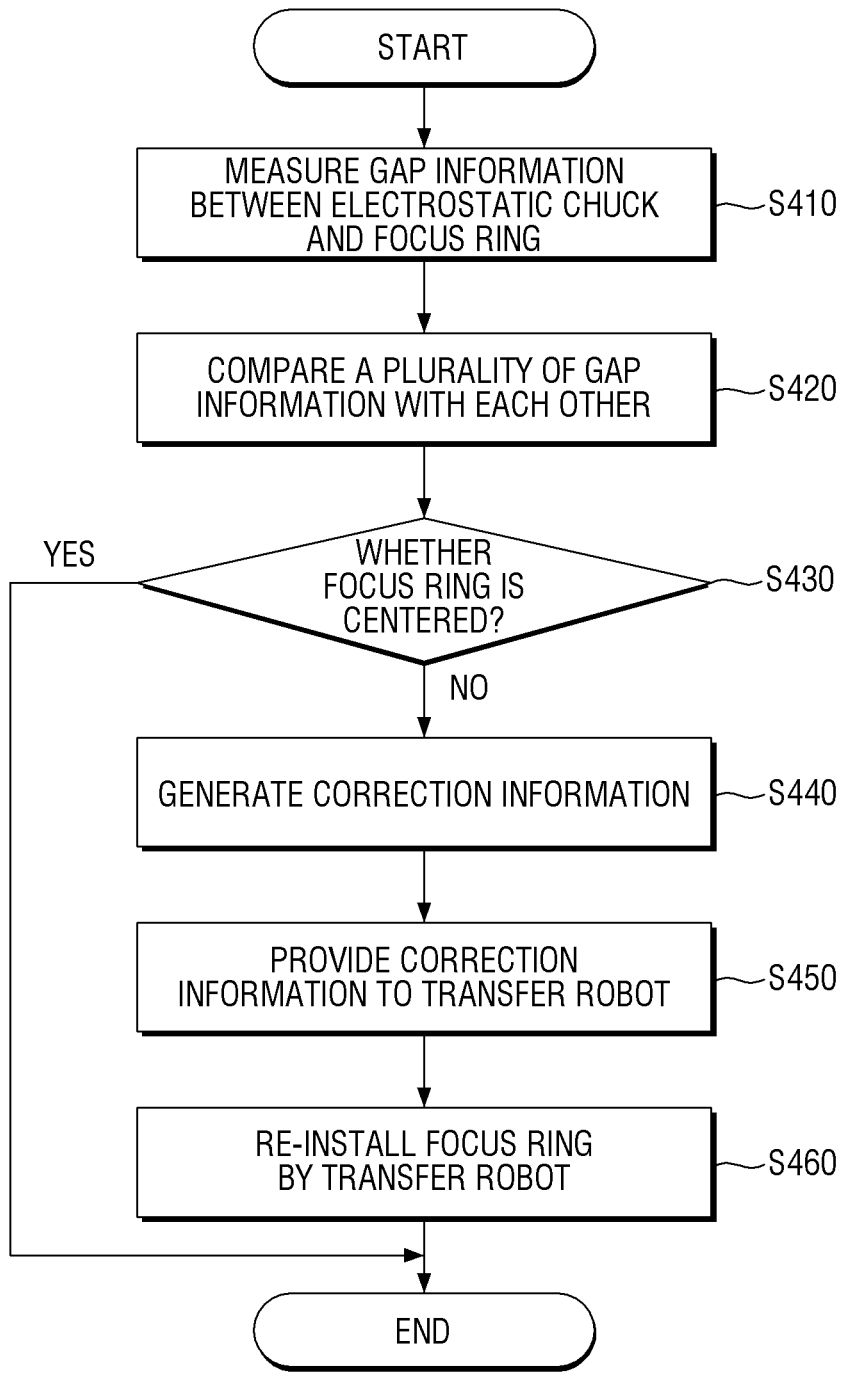
FIG. 6 is a first flowchart for illustratively describing a method of operating a control device constituting an auto teaching system according to an embodiment of the present disclosure.

FIG. 6 is a first flowchart for exemplarily describing a method of operating a control device constituting an auto teaching system according to an embodiment of the present disclosure. The following description refers to FIG. 6.

First, the control device 130 determines whether the consumable part 270 is centered in the substrate processing apparatus 110. The control device 130 determines, for example, whether the consumable part 270 is centered with respect to the chuck member 260.

In this case, the wafer type sensor 120 measures the gap between the chuck member 260 and the consumable part 270 in the substrate processing apparatus 110 (S410). At this time, the wafer type sensor 120 may measure the gap from the consumable part 270 for each side of the edge of the chuck member 260 to obtain a plurality of gap information (e.g., K1, K2, K3, K4 shown in FIG. 5). The wafer type sensor 120 may perform the above function when the consumable part 270 is replaced with a new one.

When a plurality of gap information between the chuck member 260 and the consumable part 270 are obtained by the wafer type sensor 120, the control device 130 compares the plurality of gap information with each other (S420) and determine whether the consumable part 270 is centered with respect to the chuck member 260 (430).

Specifically, the control device 130 may determine whether the consumable part 270 is centered with respect to the chuck member 260 based on whether the plurality of gap information are the same as each other, and even if the plurality of gap information are not the same as each other, it is also possible to determine whether the consumable part 270 is centered with respect to the chuck member 260 based on whether they are within an error range.

If it is determined that the consumable part 270 is not centered with respect to the chuck member 260, the control device 130 generates correction information related to the centering of the consumable part 270 based on information obtained by comparing a plurality of gap information (S440) and provides it to the transfer robot (e.g., VTR) (S450).

Thereafter, the transfer robot corrects the position of the consumable part 270 based on the correction information (that is, re-installs the consumable part 270 around the chuck member 260) (S460), and steps S410 to S460 may be repeatedly performed until the consumable part 270 is centered with respect to the chuck member 260.

The method described above with reference to FIG. 6 is an example of centering the consumable part 270 using the wafer type sensor 120. Next, an example of monitoring the remaining battery level of the wafer type sensor 120 will be described.

Figure 7:
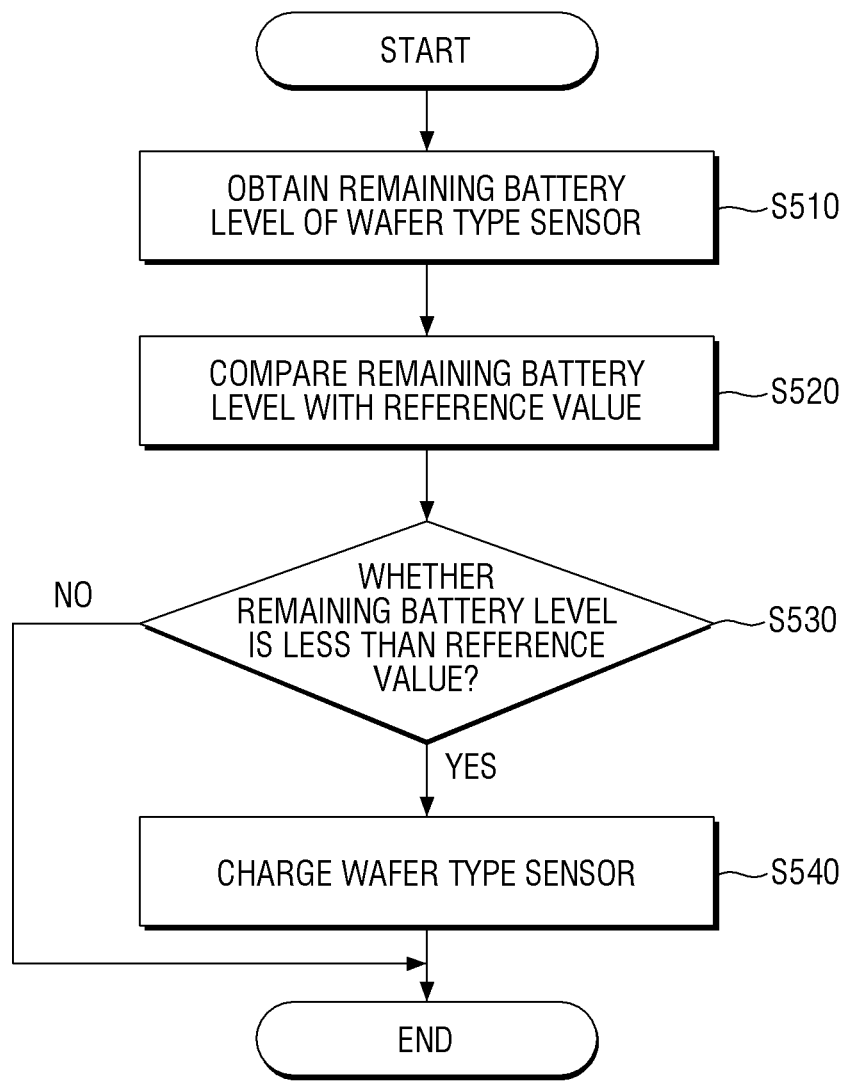
FIG. 7 is a second flowchart for illustratively describing a method of operating a control device constituting an auto teaching system according to an embodiment of the present disclosure.

FIG. 7 is a second flowchart for illustratively describing a method of operating a control device constituting an auto teaching system according to an embodiment of the present disclosure. The following description refers to FIG. 7.

First, the control device 130 communicates with the wafer type sensor 120 to obtain information on the remaining battery level of the wafer type sensor 120 (S510).

Thereafter, the control device 130 compares the remaining battery level of the wafer type sensor 120 with the reference value (S520) to determine whether the remaining battery level is less than the reference value (e.g., 30% of the total chargeable amount) (S530).

If it is determined that the remaining battery level is less than the reference value, the control device 130 controls the wafer type sensor 120 to be charged (S540). In this embodiment, the wafer type sensor 120 may be charged with power provided from a load port module (LPM) in a semiconductor device manufacturing facility to a front opening unified pod (FOUP). Specifically, the wafer type sensor 120 may be seated on a load port module (LPM) in a semiconductor device manufacturing facility and charged while being embedded in a front opening unified pod (FOUP). In this regard, a more detailed description will be given later.

On the other hand, the wafer type sensor 120 may transmit a charge request signal to the control device 130 through the first communication module 320 under the control of the first control module 350 when the remaining battery level is less than the reference value. The control device 130 may control the wafer type sensor 120 to be charged when a charge request signal of the wafer type sensor 120 is received.

In addition, the wafer type sensor 120 may send out a warning sound when the remaining battery level is less than the reference value, and the control device 130 may recognize the warning sound of the wafer type sensor 120 and control the wafer type sensor 120 to be charged. In this case, the wafer type sensor 120 may further include a voice/audio output module in addition to the components shown in FIG. 3 for sending out a warning sound.

Next, a mixed example of the case of centering the consumable part 270 using the wafer type sensor 120 and the case of monitoring the remaining battery level of the wafer type sensor 120 will be described.

Figure 8:
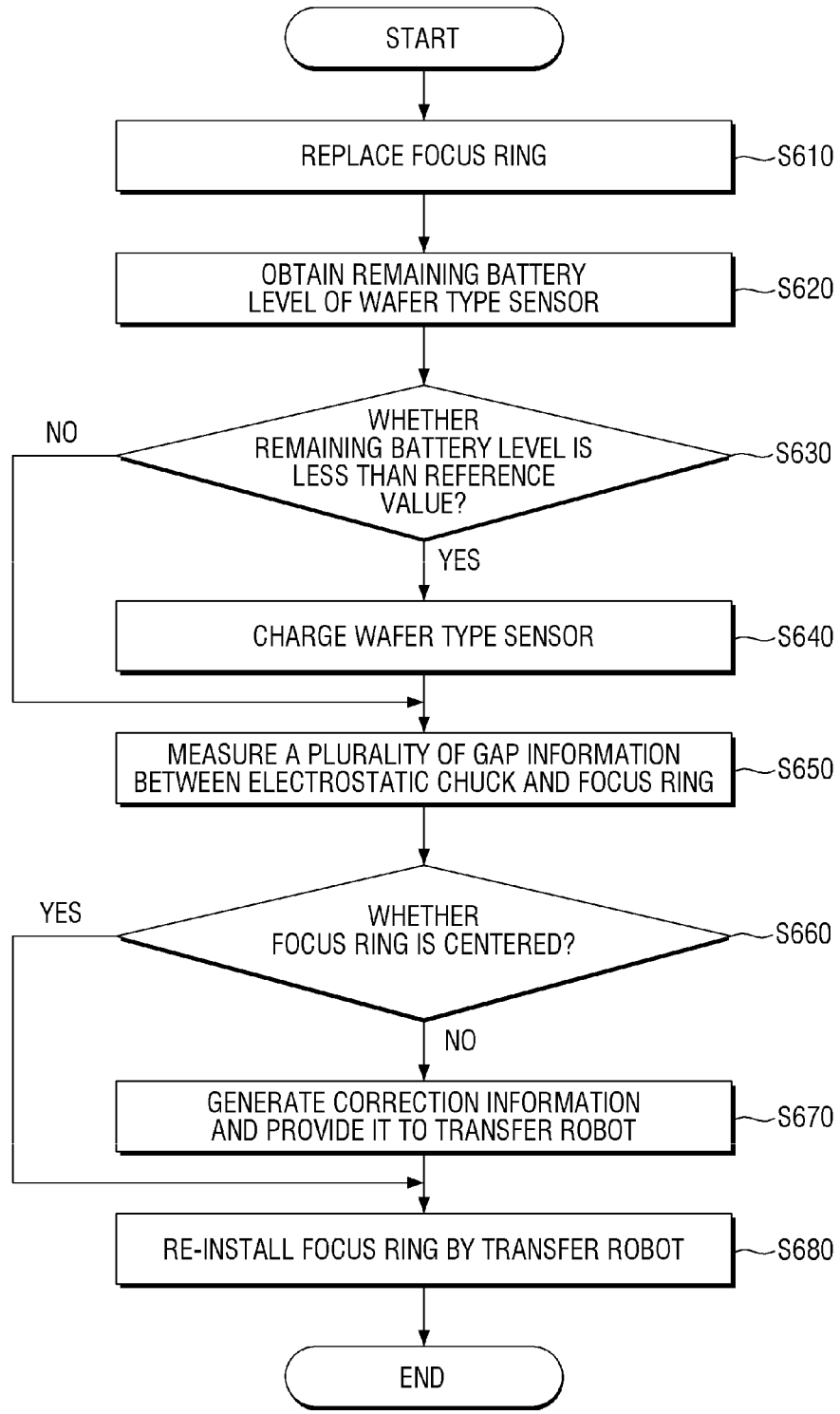
FIG. 8 is a third flowchart for illustratively describing a method of operating a control device constituting an auto teaching system according to an embodiment of the present disclosure.

FIG. 8 is a third flowchart illustrating a method of operating a control device constituting an auto teaching system according to an embodiment of the present disclosure. The following description refers to FIG. 8.

When the consumable part 270 is replaced with a new one in the substrate processing apparatus 110 (S610), the control device 130 obtains information on the remaining battery level from the wafer type sensor 120 (S620).

Thereafter, the control device 130 compares the remaining battery level of the wafer type sensor 120 with the reference value to determine whether the remaining battery level is less than the reference value (S630). When it is determined that the remaining battery level is less than the reference value, the control device 130 controls the wafer type sensor 120 to be charged (S640).

When it is determined that the remaining battery level is equal to or greater than the reference value or the wafer type sensor 120 is charged, the control device 130 determines whether the consumable part 270 is centered in the substrate processing apparatus 110.

For example, when determining whether the consumable part 270 is centered with respect to the chuck member 260, the wafer type sensor 120 obtains a plurality of gap information between the chuck member 260 and the consumable part 270 (S650). Such a function of the wafer type sensor 120 may be performed when the transfer robot carries in and out the wafer type sensor 120 into and from the substrate processing apparatus 110 under the control of the control device 130.

Thereafter, the control device 130 determines whether the consumable part 270 is centered with respect to the chuck member 260 by comparing the plurality of gap information with each other (S660).

If it is determined that the consumable part 270 is not centered with respect to the chuck member 260, the control device 130 generates correction information related to centering of the consumable part 270 based on information obtained by comparing a plurality of gap information and provides it to the transfer robot (S670).

Thereafter, the transfer robot corrects the position of the consumable part 270 around the electrostatic chuck 222 based on the correction information (S680), and steps S610 to S680 may be repeatedly performed until the consumable part 270 is centered with respect to the chuck member 260.

On the other hand, the control device 130 may monitor the remaining battery level of the wafer type sensor 120 from time to time, and when it is determined that the remaining battery level of the wafer type sensor 120 is less than the reference value, the current step is paused and then the wafer type sensor 120 may be transferred to the FOUP to be charged by controlling the VTR, ATR, etc. The ongoing step may be continued after charging the wafer type sensor 120.

The method described above with reference to FIGS. 6 to 8 may be performed by the control device 130. The control device 130 may comprise a communication module that communicates with the wafer type sensor 120, a power supply module that supplies power, and a control module that performs calculation and control functions.

The control device 130 may be implemented as a computer equipped with a processor. In this case, the method described with reference to FIGS. 6 to 8 may be provided as a program (or software (SW)) executed by the control device 130. Also, the program may be provided in a state stored in a recording medium. The recording medium is a storage medium for storing program codes executable by the processor, and may include, for example, a hard disk drive (HDD), a solid state drive (SSD), and a universal serial bus (USB).

It will be described again with reference to FIG. 1.

The storage device 140 stores the wafer type sensor 120, and the charging device 150 charges the wafer type sensor 120. In the present embodiment, the wafer type sensor 120 may be seated on the charging device 150 and charged while being accommodated in the storage device 140.

In the above, the storage device 140 may be implemented as, for example, a container type FOUP. Also, the charging device 150 may be implemented as, for example, a load port module (LPM).

Figure 9:
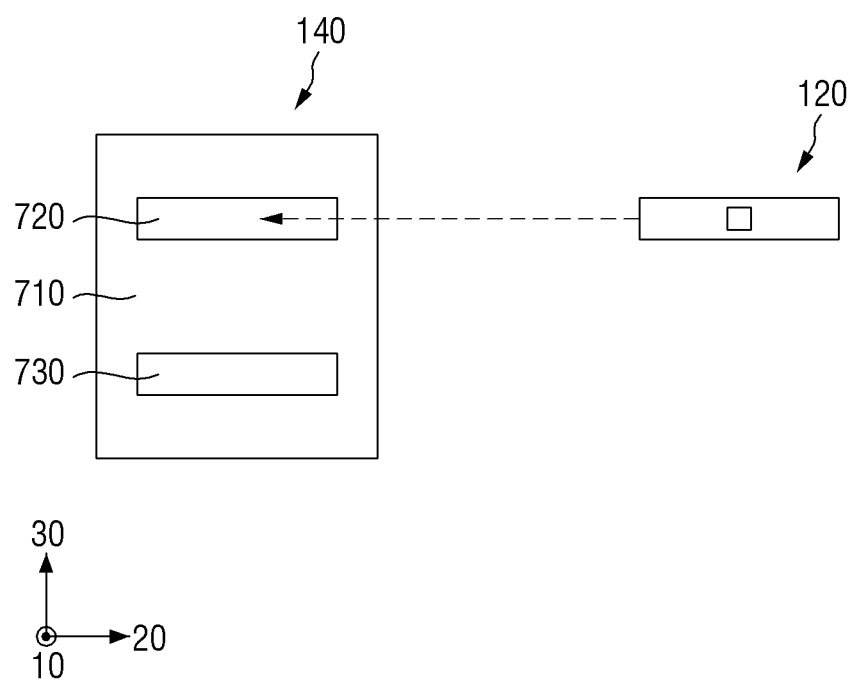
FIG. 9 is a first exemplary diagram schematically illustrating an internal structure of a storage device constituting an auto teaching system according to an embodiment of the present disclosure.

The storage device 140 may include a plurality of slots in the vertical direction (the third direction 30) therein. The storage device 140 may include, for example, as shown in FIG. 9, a first slot 720 disposed in an upper portion of the cover member 710 and a second slot 730 disposed in a lower portion in the cover member 710.

When the storage device 140 includes the first slot 720 and the second slot 730 as described above, the wafer type sensor 120 may be mounted in the first slot 720, and a consumable part 270 or a substrate (e.g., a wafer) may be mounted in the second slot 730. FIG. 9 is a first exemplary diagram schematically illustrating an internal structure of a storage device constituting an auto teaching system according to an embodiment of the present disclosure.

The wafer type sensor 120 may include a power ON/OFF switch. In this case, the power of the wafer type sensor 120 may be turned ON/OFF by the user.

However, when performing auto teaching, the user has to turn on/off the power of the wafer type sensor 120, and accordingly, there is an inconvenience in that auto teaching should always be performed manually.

In addition, when the wafer type sensor 120 is not fully charged, the power may be turned off during auto teaching. Therefore, since the wafer type sensor 120 should be stored in a separate storage box to complete the charging before the auto teaching is performed, there is also the inconvenience of delaying the work time.

In this embodiment, in order to solve this problem, when the wafer type sensor 120 is stored in the storage device 140, the storage device 140 may automatically charge the wafer type sensor 120. At this time, the control device 130 monitors the state of charge of the wafer type sensor 120, and may control the storage device 140 to perform the above function (i.e., automatically charges the wafer type sensor 120) based on the monitoring result.

Meanwhile, the control device 130 may manage the wafer type sensor 120 by continuously monitoring the state of charge of the wafer type sensor 120 even after the charging of the wafer type sensor 120 is completed.

In this embodiment, it is possible to implement full auto teaching of the auto teaching system 100 through the problem solving method as described above, and to maximize the storage and work efficiency of the wafer type sensor 120 using OHT (Over Head Transport).

The storage device 140 may include a battery charging module to charge the battery of the wafer type sensor 120. Hereinafter, this will be described in detail.

Figure 10:
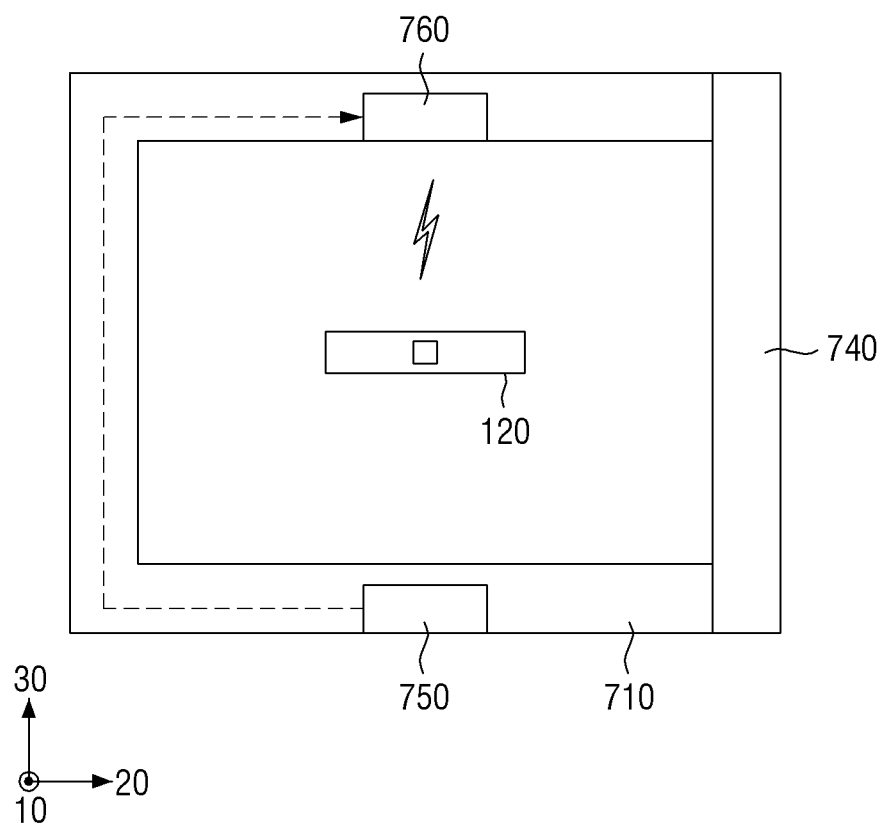
FIG. 10 is a second exemplary diagram schematically illustrating an internal structure of a storage device constituting an auto teaching system according to an embodiment of the present disclosure.

FIG. 10 is a second exemplary diagram schematically illustrating an internal structure of a storage device constituting an auto teaching system according to an embodiment of the present disclosure.

Referring to FIG. 10, the storage device 140 may comprise a cover member 710, a door member 740, a connecting module 750, and a power transmission module 760.

The storage device 140 may charge the wafer type sensor 120 as described above. The storage device 140 may be implemented as, for example, a vision wafer dedicated FOUP, on which a charging system is mounted.

The cover member 710 constitutes the outer shape of the storage device 140. An openable and closable door member 740 may be installed on at least one side of the cover member 710 to store the wafer type sensor 120 therein.

When the door member 740 is opened, the wafer type sensor 120 may be stored inside the cover member 710. At least one wafer type sensor 120 may be stored in the inner space of the cover member 710, and at this time, a slot (e.g., the first slot 720 of FIG. 9) may be provided to support each wafer type sensor 120.

The connecting module 750 receives power from the outside. When power is supplied from the outside, the connecting module 750 may transmit power to the power transmission module 760 in a wired or wireless manner.

The power transmission module 760 transmits the power received from the connecting module 750 to the wafer type sensor 120. The power transmission module 760 may allow the wafer type sensor 120 to be charged through this.

In this embodiment, the storage device 140 may wirelessly charge the wafer type sensor 120 using the power transmission module 760. In this case, the storage device 140 may wirelessly charge the wafer type sensor 120 using a magnetic resonance method. In this case, the storage device 140 may include a coil for supporting magnetic resonance charging.

However, the present embodiment is not limited thereto. The storage device 140 may wirelessly charge the wafer type sensor 120 using an electromagnetic induction method.

Meanwhile, the storage device 140 may wirelessly charge the wafer type sensor 120 by selecting any one of a magnetic resonance method and an electromagnetic induction method. In this case, the storage device 140 may select any one of a magnetic resonance method and an electromagnetic induction method based on the distance between the power transmission module 760 and the wafer type sensor 120 to wirelessly charge the wafer type sensor 120.

For example, if the distance between the power transmission module 760 and the wafer type sensor 120 is less than the reference distance, the storage device 140 wirelessly charges the wafer type sensor 120 using an electromagnetic induction method. If the distance between the transmission module 760 and the wafer type sensor 120 exceeds the reference distance, the storage device 140 may wirelessly charge the wafer type sensor 120 using a magnetic resonance method.

Meanwhile, when the distance between the power transmission module 760 and the wafer type sensor 120 is the same as the reference distance, the storage device 140 may use any one of an electromagnetic induction method and a magnetic resonance method.

Meanwhile, in the present embodiment, the storage device 140 may charge the wafer type sensor 120 in wire.

The storage device 140 may automatically charge the wafer type sensor 120 when the wafer type sensor 120 is mounted therein. However, the present embodiment is not limited thereto. The storage device 140 may charge the wafer type sensor 120 according to the monitoring result of the state of charge of the wafer type sensor 120.

Figure 11:
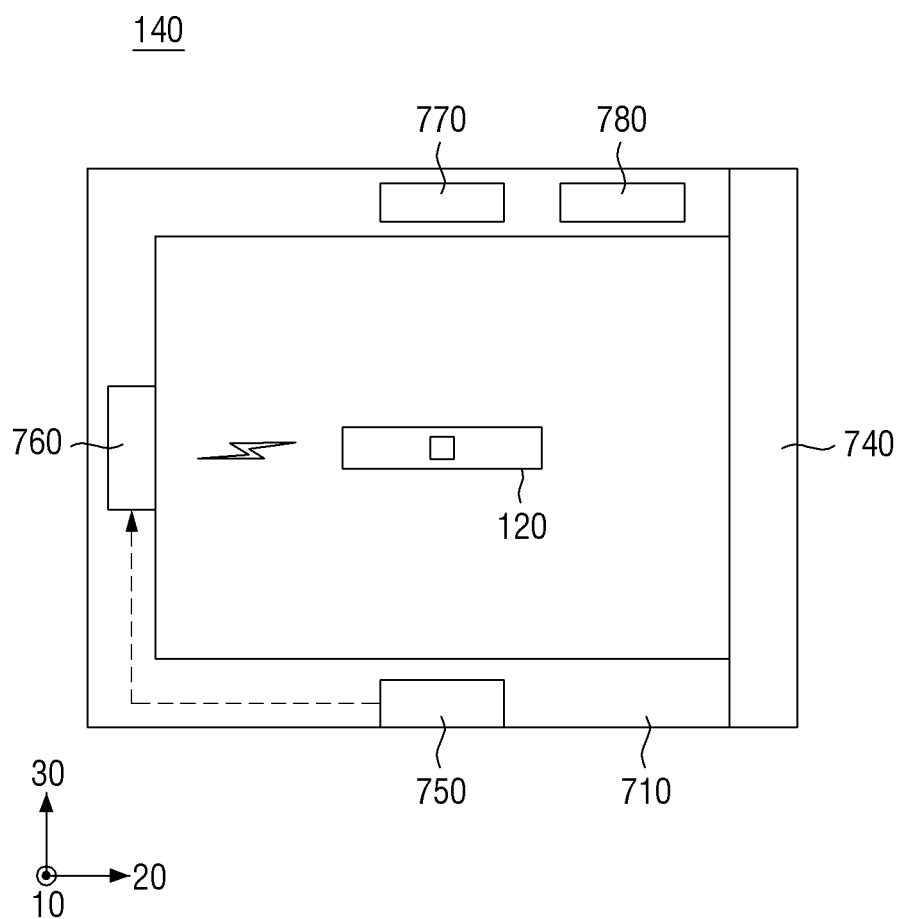
FIG. 11 is a third exemplary diagram schematically illustrating an internal structure of a storage device constituting an auto teaching system according to an embodiment of the present disclosure.

FIG. 11 is a third exemplary diagram schematically illustrating an internal structure of a storage device constituting an auto teaching system according to an embodiment of the present disclosure.

Referring to FIG. 11, the storage device 140 may comprise a cover member 710, a door member 740, a connecting module 750, a power transmission module 760, a second communication module 770, and a second control module 780.

The cover member 710, the door member 740, the connecting module 750, and the power transmission module 760 have been described above with reference to FIG. 10, and detailed descriptions thereof will be omitted herein.

The second communication module 770 transmits information on the state of charge of the wafer type sensor 120 to the control device 130. The second communication module 770 may perform the above function under the control of the second control module 780.

The control device 130 may instruct the storage device 140 to charge the wafer type sensor 120 according to the state of charge of the wafer type sensor 120. For example, if the charging value of the wafer type sensor 120 is less than a reference value (e.g., 30% compared to full charge, 50% compared to full charge, etc.), the control device 130 may instruct the storage device 140 to charge the wafer type sensor 120. In this case, the power transmission module 760 may supply power to the wafer type sensor 120 under the control of the second control module 780.

In addition, when the charging value of the wafer type sensor 120 is equal to or greater than the reference value, the control device 130 may not instruct the storage device 140 to charge the wafer type sensor 120. In this case, the storage device 140 may stand by without charging the wafer type sensor 120.

Meanwhile, in the present embodiment, it is also possible for the second control module 780 to determine whether to perform charging on the wafer type sensor 120.

As described above, when power is supplied from the outside, the connecting module 750 may transmit power to the power transmission module 760. For example, the connecting module 750 may receive power from the power supply module 821 (e.g., power box) through the switching module 822 (e.g., relay module) and the power conversion module 823 installed in the load port module 820 when the storage device 140 is moved by a container transfer device 810 (e.g., OHT (Overhead Hoist Transport)) and seated on a load port module (LPM) in a semiconductor device manufacturing facility.

In addition, in this embodiment, when the storage device 140 is seated on the load port module 820, the control device 130 may monitor the state of the charge of the wafer type sensor 120 in the storage device 140, and control the power supply module 821, the switching module 822, and the power conversion module 823 according to the monitoring result. In this case, a front end module (FEM) 830 such as SFEM or EFEM may serve as the control device 130.

In the above, the power supply module 821 serves to supply power. The power supply module 821 may be installed in the load port module 820, but may be installed outside the load port module 820.

Figure 12:
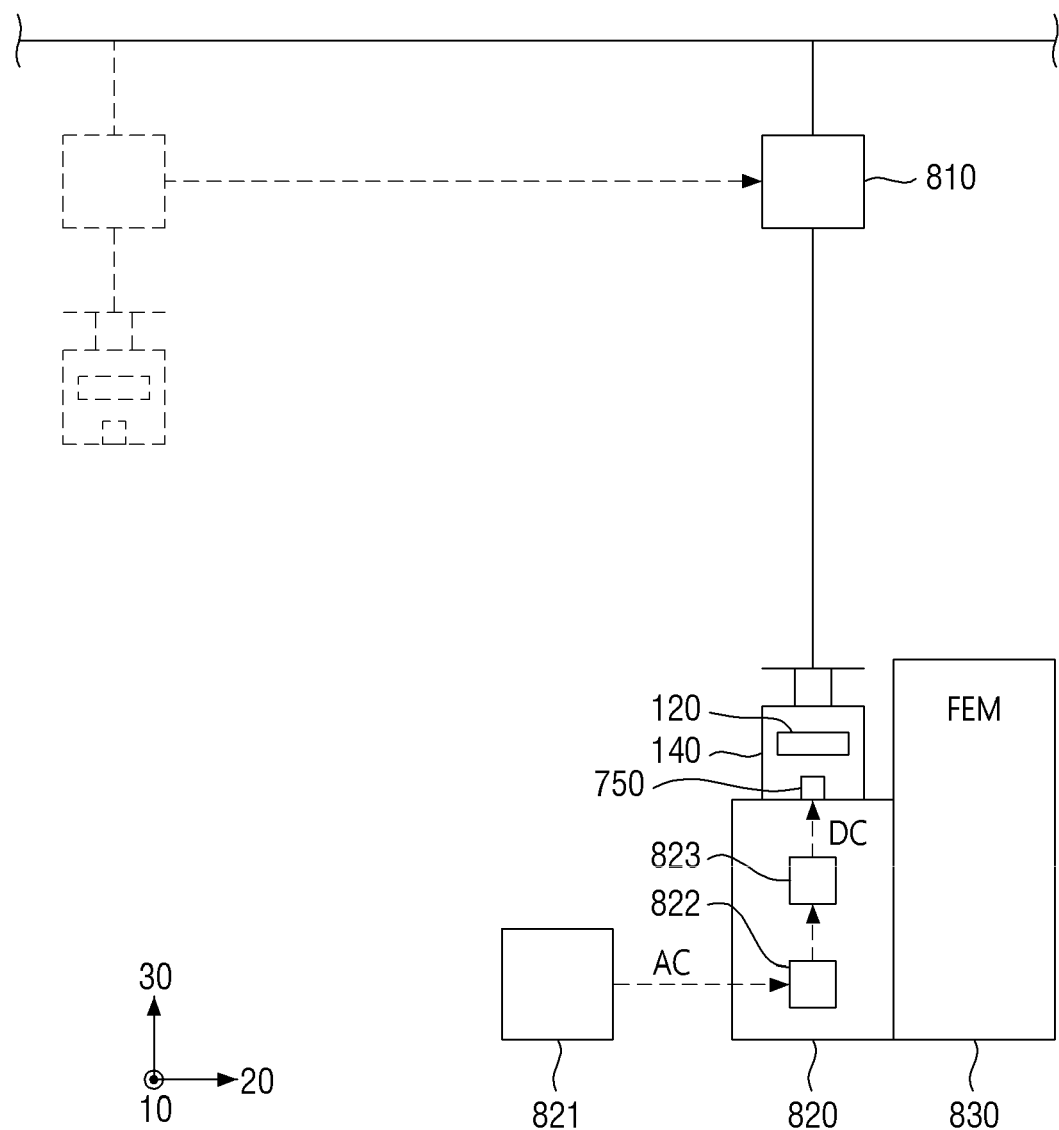
FIG. 12 is a diagram schematically illustrating an internal structure of a load port module constituting an auto teaching system according to an embodiment of the present disclosure.

The switching module 822 is to control the flow of power supplied by the power supply module 821, and the power conversion module 823 is to convert the AC power supplied by the power supply module 821 to DC power. FIG. 12 is a diagram schematically illustrating an internal structure of a load port module constituting an auto teaching system according to an embodiment of the present disclosure.

Figure 13:
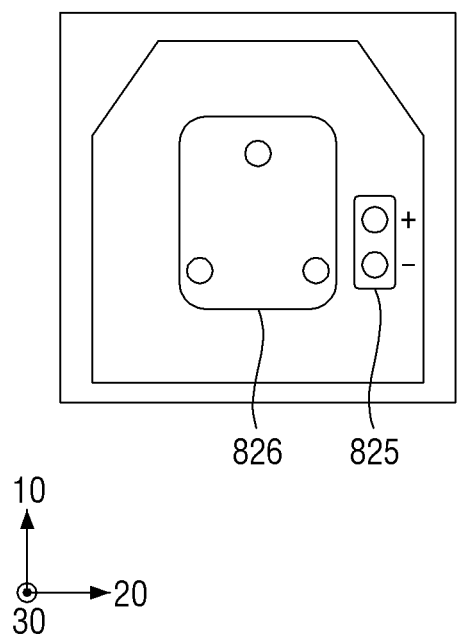
FIG. 13 is an exemplary diagram schematically illustrating a structure of a power output terminal constituting the load port module of FIG. 12.

On the other hand, the load port module 820 may include a power output terminal 824 on the upper portion to be electrically connected to the connecting module 750 of the storage device 140 when the storage device 140 is seated thereon. The power output terminal 824 may include a DC power output PIN 825 and a FOUP align PIN 826, to which the connecting module 750 may be connected. The FOUP align PIN 826 may be composed of, for example, three outputs. FIG. 13 is an exemplary diagram schematically illustrating a structure of a power output terminal constituting the load port module of FIG. 12.

In the above, it has been described that the power supply module 821, the switching module 822, the power conversion module 823 and the power output terminal 824 are installed in the load port module 820 to charge the battery of the wafer type sensor 120. In this embodiment, the battery charging device may be defined as a concept including a power supply module 821, a switching module 822, a power conversion module 823, and a power output terminal 824.

Figure 14:
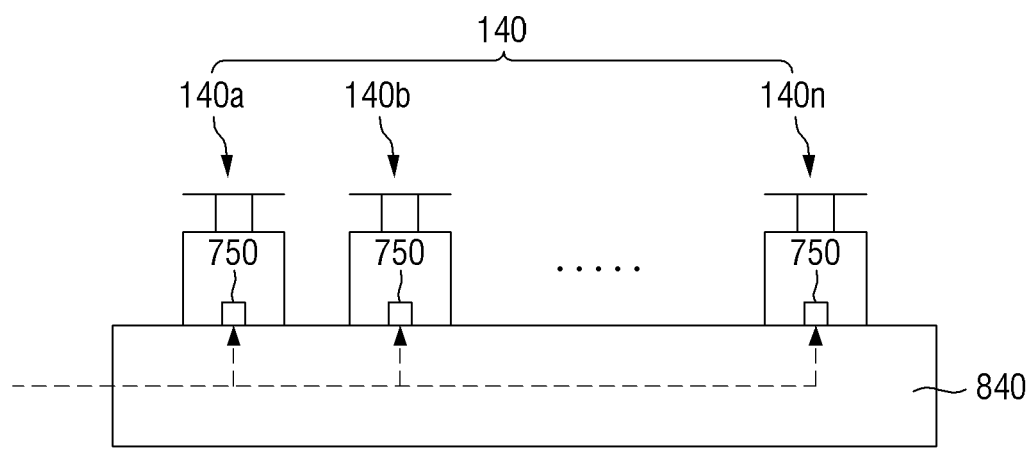
FIG. 14 is an exemplary view for describing a storage method when not in use of a storage device constituting an auto teaching system according to an embodiment of the present disclosure.

On the other hand, when the wafer type sensor 120 is not used, the storage device 140 may be stored on a separately provided rack 840 as shown in FIG. 14. The rack 840 may be implemented as a FOUP dedicated storage Rack, and may store a plurality of storage devices 140*a*, 140*b*, . . . , 140*n*. The wafer type sensor 120 in the storage devices 140*a*, 140*b*, . . . , 140*n* may be charged using DC power supplied through the rack 840. FIG. 14 is an exemplary view for describing a storage method when not in use of a storage device constituting an auto teaching system according to an embodiment of the present disclosure.

In the present embodiment, as described above, the wafer type sensor 120 may be charged on the charging device 150, that is, the load port module 820, while being mounted in the storage device 140, that is, the FOUP. In this case, the load port module 820 may provide power for charging the wafer type sensor 120 in the FOUP.

Hereinafter, a semiconductor device manufacturing facility including the load port module (LPM) will be described.

Figure 15:
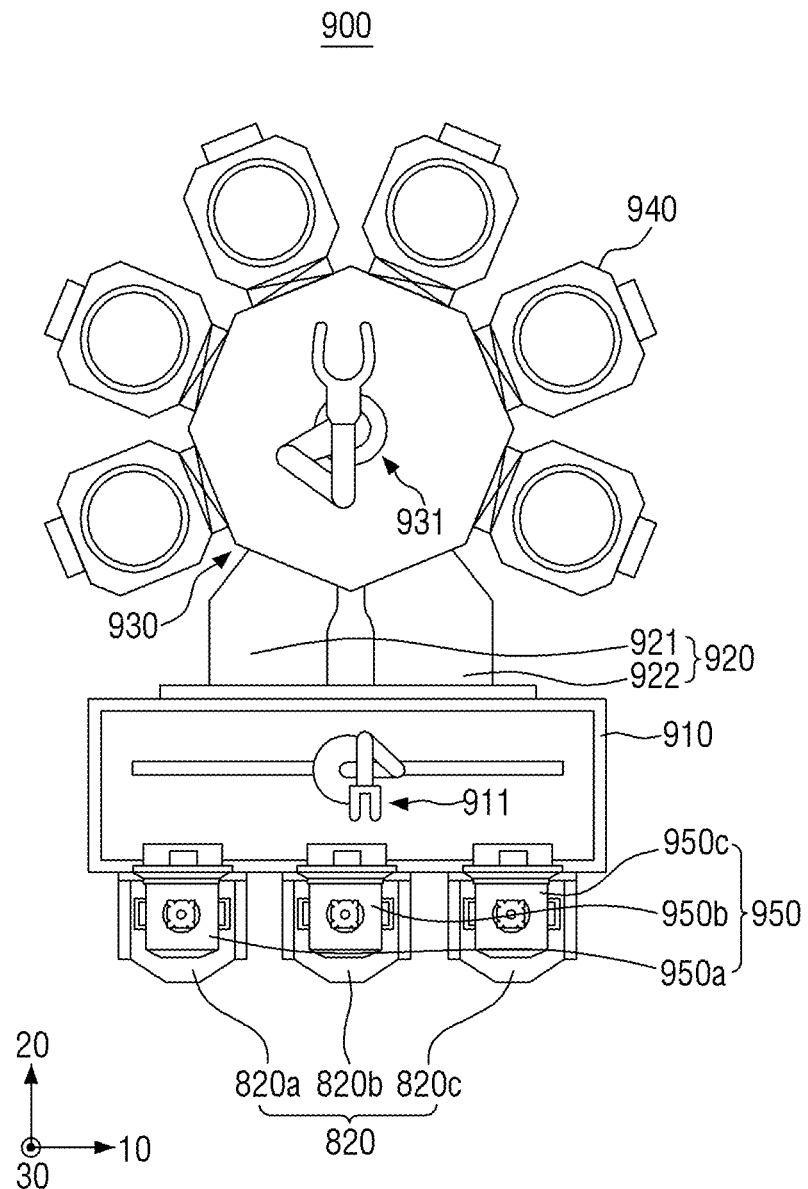
FIG. 15 is an exemplary view of a semiconductor device manufacturing facility including a load port module according to the first embodiment.

FIG. 15 is an exemplary view of a semiconductor device manufacturing facility including a load port module according to the first embodiment.

Referring to FIG. 15, a semiconductor device manufacturing facility 900 includes a load port module (LPM) 820, an index module 910, a load-lock chamber 920, a transfer chamber 930, and a process chamber 940.

The semiconductor device manufacturing facility 900 is a system for processing a plurality of substrates (e.g., wafers) through various processes such as an etching process and a cleaning process. The semiconductor device manufacturing facility 900 may be implemented as a multi-chamber type substrate processing system including transfer robots 911 and 931 in charge of transferring substrates and a plurality of process chambers 940 serving as substrate processing modules provided around them.

In the load port module 820, a container 950 (e.g., a front opening unified pod (FOUP)), in which a plurality of substrates are mounted, is seated. A plurality of such load port modules 820 may be disposed in front of the index module 910. In the above, the container 950 is substantially the same concept as the storage device 140, except that the reference number is different.

When a plurality of load port modules 820 are disposed in front of the index module 910, different objects may be mounted in the containers 950 seated on each load port module 820. When three load port modules 820 are disposed in front of the index module 910, for example, the first container 950*a* seated on the first load port 820*a* on the left side may mount the wafer type sensor 120, the second container 950*b* seated on the second load port 820*b* in the middle may mount a substrate (wafer), and the third container 950*c* seated on the third load port 820*c* on the right side may mount the consumable part 270.

However, the present embodiment is not limited thereto. The containers 950*a*, 950*b*, and 950*c* seated on each of the load ports 820*a*, 820*b*, and 820*c* may mount the same object. For example, each of the containers 950*a*, 950*b*, and 950*c* may mount the wafer type sensor 120, a substrate, a consumable part, and the like.

On the other hand, it is also possible that containers seated on several load ports mount the same object, and containers seated on several other load ports mount different objects. For example, the first container 950*a* and the second container 950*b* may mount the wafer type sensor 120 and a substrate, and the third container 950*c* may mount a consumable part.

The index module 910 is disposed between the load port module 820 and the load-lock chamber 920 and interfaces to transfer the substrate between the container 950 and the load-lock chamber 920 on the load port module 820. The index module 910 may be implemented as a front end module (FEM) such as SFEM or EFEM.

The index module 910 may include a first transfer robot 911 in charge of transferring the substrate. The first transfer robot 911 operates in an atmospheric pressure environment, and may transfer a substrate between the container 950 and the load-lock chamber 920.

The load-lock chamber 920 serves as a buffer between an input port and an output port on the semiconductor device manufacturing facility 900. The load-lock chamber 920 may include a buffer stage, in which the substrate temporarily stands by.

A plurality of load-lock chambers 920 may be provided between the index module 910 and the transfer chamber 930. In this embodiment, for example, two load-lock chambers 921 and 922 such as a first load-lock chamber 921 and a second load-lock chamber 922 may be provided between the index module 910 and the transfer chamber 930.

The first load-lock chamber 921 and the second load-lock chamber 922 may be disposed between the index module 910 and the transfer chamber 930 in the first direction 10. In this case, the first load-lock chamber 921 and the second load-lock chamber 922 may be provided in a mutually symmetrical single-layer structure arranged side by side in the left-right direction. In the above, the first direction 10 means a horizontal direction with respect to the arrangement direction of the index module 910 and the transfer chamber 930.

However, the present embodiment is not limited thereto. The first load-lock chamber 921 and the second load-lock chamber 922 may be disposed in the third direction 30 between the index module 910 and the transfer chamber 930. In this case, the first load-lock chamber 921 and the second load-lock chamber 922 may be provided in a multi-layer structure disposed in the vertical direction. In the above, the third direction 30 means a direction perpendicular to the arrangement direction of the index module 910 and the transfer chamber 930.

The first load-lock chamber 921 may transfer a substrate from the index module 910 to the transfer chamber 930, and the second load-lock chamber 922 may transfer a substrate from the transfer chamber 930 to the index module 910. However, the present embodiment is not limited thereto. The first load-lock chamber 921 may transfer a substrate from the transfer chamber 930 to the index module 910, and the second load-lock chamber 922 may transfer a substrate from the index module 910 to the transfer chamber 930.

In the load-lock chamber 920, a substrate may be loaded or unloaded by the second transfer robot 931 of the transfer chamber 930. In the load-lock chamber 920, a substrate may be loaded or unloaded by the first transfer robot 911 of the index module 910.

The load-lock chamber 920 may maintain a pressure while changing its interior into a vacuum environment and an atmospheric pressure environment by using a gate valve or the like. The load-lock chamber 920 may prevent the internal atmospheric pressure state of the transfer chamber 930 from being changed through this.

More specifically, when a substrate is loaded or unloaded by the second transfer robot 931, the load-lock chamber 920 may form its interior as a vacuum environment the same as (or close to) that of the transfer chamber 930. In addition, the load-lock chamber 920 may form it interior as an atmospheric pressure environment when a substrate is loaded or unloaded by the first transfer robot 911 (that is, an unprocessed substrate is supplied from the first transfer robot 911, or a pre-processed substrate is transferred to the index module 910).

The transfer chamber 930 transfers a substrate between the load-lock chamber 920 and the process chamber 940. The transfer chamber 930 may include at least one second transfer robot 931 for this purpose.

The second transfer robot 931 transfers an unprocessed substrate from the load-lock chamber 920 to the process chamber 940, or transfers a pre-processed substrate from the process chamber 940 to the load-lock chamber 920. Each side of the transfer chamber 930 may be connected to the load-lock chamber 920 and the plurality of process chambers 940 for this purpose.

Meanwhile, the second transfer robot 931 operates in a vacuum environment and may be freely rotated.

The process chamber 940 is for processing a substrate. The process chamber 940 may be implemented as an etching chamber for processing a substrate using an etching process, for example, as a plasma reaction chamber for etching a substrate using a plasma process.

A plurality of process chambers 940 may be disposed around the transfer chamber 930. In this case, each process chamber 940 may receive a substrate from the transfer chamber 930 to process the substrate, and provide the processed substrate to the transfer chamber 930.

The process chamber 940 may have a cylindrical shape. The process chamber 940 may have a surface made of alumite, on which an anodic oxide film is formed, and an inside thereof may be hermetically configured. Meanwhile, the process chamber 940 may be formed in a shape other than the cylindrical shape in the present embodiment.

The semiconductor device manufacturing facility 900 may be formed in a structure having a cluster platform. In this case, the plurality of process chambers 940 may be disposed in a cluster manner with respect to the transfer chamber 930, and the plurality of load-lock chambers 920 may be disposed in the first direction 10.

Figure 16:
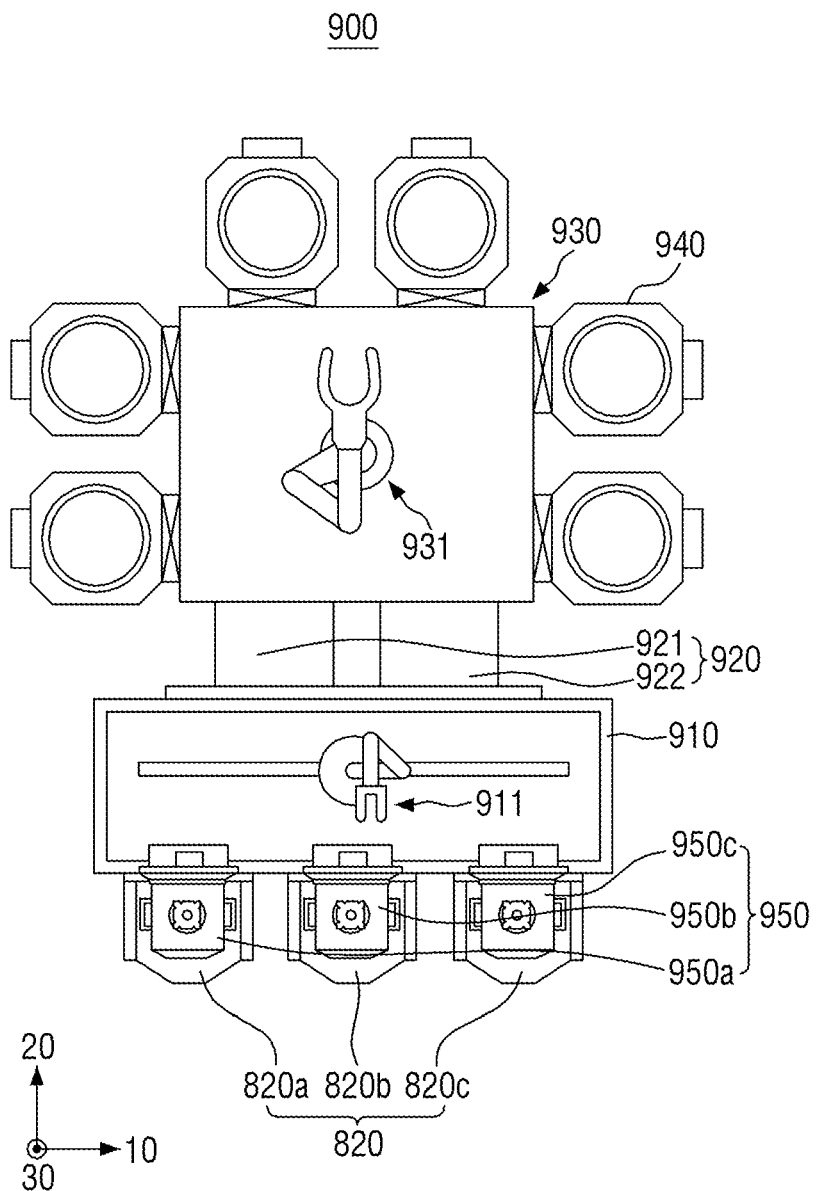
FIG. 16 is an exemplary view of a semiconductor device manufacturing facility including a load port module according to a second embodiment.

However, the present embodiment is not limited thereto. The semiconductor device manufacturing facility 900 may be formed in a structure having a quad platform as shown in FIG. 16. In this case, the plurality of process chambers 940 may be disposed in a quad manner with respect to the transfer chamber 930. FIG. 16 is an exemplary view of a semiconductor device manufacturing facility including a load port module according to a second embodiment.

Figure 17:
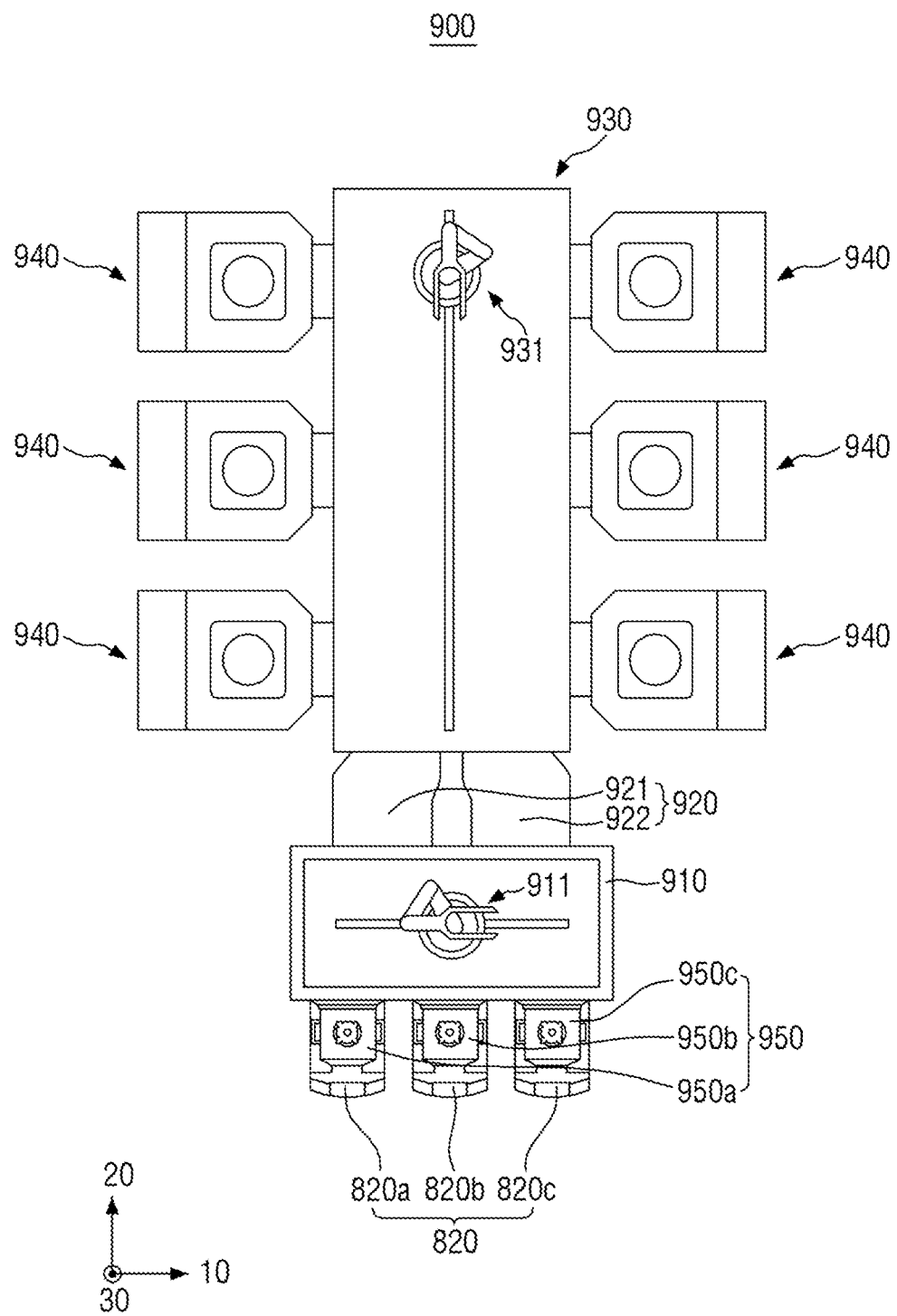
FIG. 17 is an exemplary view of a semiconductor device manufacturing facility including a load port module according to a third embodiment.

Meanwhile, the semiconductor device manufacturing facility 900 may be formed in a structure having an in-line platform as shown in FIG. 17. In this case, the plurality of process chambers 940 may be disposed in an inline manner with respect to the transfer chamber 930, and a pair of process chambers 940 may be disposed in series on both sides of each transfer chamber 930. FIG. 17 is an exemplary view of a semiconductor device manufacturing facility including a load port module according to a third embodiment.

Although embodiments of the present disclosure have been described with reference to the above and the accompanying drawings, those of ordinary skill in the art to which the present disclosure pertains can understand that the present disclosure can be practiced in other specific forms without changing its technical spirit or essential features. Therefore, it should be understood that the embodiments described above are illustrative in all respects and not limiting.

What is claimed is:

1. A substrate processing system comprising:
a load port module configured to dispose a container which loads a sensor;
an Equipment Front End Module (EFEM) including a first transfer robot which transfers the sensor from the load port module;
a load lock chamber configured to connect to the EFEM and switching between a first environment, which is an atmospheric pressure environment, and a second environment, which is a vacuum environment;

a transfer chamber including a second transfer robot which transfers the sensor from the load lock chamber; and a process chamber configured to connect to the transfer chamber and including an Electrostatic Chuck (ESC) and a focus ring surrounding an outer surface of the ESC, wherein the sensor configured to be charged wirelessly based on a power of the substrate processing system, wherein the container includes a charging unit for charging the sensor loaded on a slot therein and a contact unit configured to contact with a charging device, wherein the charging unit is configured to charge the sensor using a magnetic resonance method, wherein the charging device includes a power output terminal configured to supply a power for charging of the sensor, wherein the charging unit is disposed on an upper surface of the container, wherein the contact unit is disposed on a lower surface of the container, and wherein the power output terminal is disposed on the load port module.

2. The substrate processing system of claim 1,
the container includes a plurality of slots therein, and
the sensor and a processed wafer are loaded into different slots.

3. The substrate processing system of claim 1,
wherein the container is equipped with the sensor configured to sense at least a part of a semiconductor device manufacturing facility and a control module, wherein the container comprises a communication module, the control module configured to control the communication module to communicate information on a state of charge of the sensor to a control device, and wherein the control module is configured to charge the sensor using the load port module having the battery charging device in response to receiving an instruction from the control device regarding a monitoring result of a remaining battery level of the sensor.

4. The substrate processing system of claim 1,
wherein the container comprises a plurality of slots installed in a vertical direction inside the container.

5. The substrate processing system of claim 1, wherein the container comprises:
a first slot installed inside the container; and
a second slot installed under the first slot,
wherein different objects are mounted in the first slot and the second slot.

6. The substrate processing system of claim 1, wherein the container charges the sensor using at least one of a magnetic resonance method and an electromagnetic induction method.

7. The substrate processing system of claim 1, wherein the sensor is mounted in the container for charging the sensor.

8. The substrate processing system of claim 1, wherein the charging device comprises,
a power supply module for supplying first power;
a power conversion module installed inside the load port module and for converting the first power into second power; and
a power output terminal installed above the load port module and connected to a connector of the container.

* * * * *